(12) United States Patent
Yeh et al.

(10) Patent No.: US 7,109,075 B2
(45) Date of Patent: Sep. 19, 2006

(54) METHOD FOR FABRICATION OF POLYCRYSTALLIN SILICON THIN FILM TRANSISTORS

(75) Inventors: Ching-Fa Yeh, Hsinchu (TW); Tien-Fu Chen, Hsinchu (TW); Jen-Chung Lou, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/601,701

(22) Filed: Jun. 24, 2003

(65) Prior Publication Data

US 2004/0241921 A1 Dec. 2, 2004

(30) Foreign Application Priority Data

May 29, 2003 (TW) .............................. 92114624 A

(51) Int. Cl.
*H01L 21/00* (2006.01)
(52) U.S. Cl. .................. 438/166; 438/487; 438/795
(58) Field of Classification Search ................ 438/149, 438/151, 164, 166, 311, 406, 412, 378, 479, 438/482, 486–490, 595, 596, 704, 735, 745, 438/764, 795, 800, 902
See application file for complete search history.

(56) References Cited

U.S. PATENT DOCUMENTS

| | | | |
|---|---|---|---|
| 4,330,363 A | 5/1982 | Biegesen et al. | |
| 4,592,799 A | 6/1986 | Hayafuji | |
| 5,021,119 A | 6/1991 | Fan et al. | |
| 5,395,481 A | 3/1995 | McCarthy | |
| 5,589,406 A * | 12/1996 | Kato et al. | 438/164 |
| 6,100,119 A * | 8/2000 | Jang et al. | 438/151 |
| 6,495,405 B1 | 12/2002 | Voutsas et al. | |
| 6,689,647 B1 * | 2/2004 | Joo et al. | 438/151 |
| 2004/0026738 A1 * | 2/2004 | Hasegawa | 257/347 |

OTHER PUBLICATIONS

High-Performance Low-Temperature Poly-Si TFTs Crystallized by Excimer Laser with Recessed-Channel Structure, Lin et al., IEEE Electron Device Letters, vol. 22, No. 6, Jun. 2001, pp. 269-271.
Performance Improvement Obtained for Thin-Fil Transistors Fabricated in Prepatterned Laser-Recrystallized Polysilicon, Giust et al., IEEE Electron Device Letters, vol. 18, No. 6, Jun. 1997, pp. 296-298.
Comparison of excimer laser recytstallized prepatterned and unpatterned silicon films on $SiO_2$, Giust et al., J.Appl.Phys. 81(3), Feb. 1, 1997, pp. 1204-1211.
High-Performance Single Crystalline-Silicon TFTs on a Non-Alkali Glass Substrate, Sano et al. Fujitsu Laboratories Ltd., Atsugi 243-0197, Japan (C) 2002 IEEE.

* cited by examiner

*Primary Examiner*—Lynne A. Gurley
*Assistant Examiner*—Stanetta Isaac
(74) *Attorney, Agent, or Firm*—Troxell Law Office PLLC

(57) ABSTRACT

A method for fabricating polycrystalline silicon film transistors, which includes a polysilicon spacer capping onto a sidewall of an active layer in the thin film transistors by an isotropic dry etching of the silicon film. This method suppresses the shrinkage of the active layer during recrystallization by the laser. Large grains are formed in the channel after recrystallization utilizing a high-energy continuous wavelength laser or an excimer laser annealing the active layer. This process does not require an additional mask. Uniform arrangement of grain boundaries and large grain sizes promotes uniformity of performance of the device, which is important in the fields of low temperature polycrystalline silicon thin film transistors (LTPS-TFTs).

7 Claims, 7 Drawing Sheets

METHOD FOR FABRICATION OF POLYCRYSTALLIN SILICON THIN FILM TRANSISTORS

BACKGROUND OF THE INVENTION

1. Field of the Invention

The present invention relates to a method for manufacturing polycrystalline silicon thin film transistors with a laser-recrystallized active layer. More particularly, the present invention forms a large silicon grain structure of the active layer without an additional mask.

2. Description of the Prior Art

In growing the thin film transistor display from a low temperature polycrystalline silicon thin film transistor (LTPS-TFT) extending over an amorphous silicon thin film transistor (a-si TFT), it has been proposed to use various conventional display devices, such as, personal digital assistant, digital camera, cell phone so as to substantially enhance resolution, brightness, size and electromagnetic disturbance by LTPS-TFT display.

However, such conventional laser annealing LTPS-TFTs process has proven to be unsatisfactory. When forming the active layer of transistor after the laser recrystallization is used to fabricate LTPS-TFTs, the resulting silicon grain structure typically lacks uniform structure. Such nonuniformity is due to the small and irregular silicon grain which causes the difference of electric characteristic between elements. But, when the laser recrystallization are formed after the active layer of transistor are used to fabricate LTPS-TFTs, the resulting surface tension causes shrinkages, which are caused by melting the silicon film. Therefore, the conventional method can not be used to produce LTPS-TFTs.

The structure of a TFT and silicon-on-insulator metal oxide semiconductor field effect transistor (SOI-MOSFET) is an insulated layer with poor thermo conductivity under the active layer. When a working current of the device is large a high temperature in the active layer can suddenly be produced, such that a mobility rate of a carrier of the active layer is diminished, so that the relative study reports the division of channel W into parallel connection of many small channels $W_1$ to overcome self-heating effect as shown in FIG. 7. It shows a conventional view of settlement of self-heating effect. More particularly, the conventional division of channel W into two parallel connection of many small channels $W_1$ cannot be sufficiently overcome by dispersing heat during the large working current, unlike the present invention.

SUMMARY OF THE INVENTION

Accordingly, the present invention discloses a method for fabrication of polycrystalline silicon thin film transistors, which comprises a polysilicon spacer capping onto a sidewall of the active layer in thin film transistors by an isotropic dry etching process for silicon film.

Therefore, the present invention provides uniform arrangement of grain boundaries and large grain sizes of active layer.

The main object of the present invention is to provide high mobility of a field effect carrier of a low temperature polycrystalline silicon thin film transistor (LTPS-TFT) and diminish a difference between the devices. Therefore, the resolution of display is substantially improved by the present invention on a pixel of the driving transistor to form small channel width have large silicon grain structure. Moreover, the laser-recrystallized process window is substantially broad to improve the performance and uniformity of the device.

The other object of this invention is the benefit of not requiring an additional mask for recrystallization of the melted lateral silicon after excimer laser annealing and improving the self-heating effect caused by dispersing the heat of the high working current. The fabrication of polycrystalline silicon thin film transistors employ high energy continuous wavelength laser on a dog-bone shaped active layer by source-drain directional scanning to improve the channel of the transistor of a silicon grain and then to have high performance and good uniformity.

A method for fabrication of polycrystalline silicon thin film transistors comprising the steps of:

a) selecting a substrate;

b) forming a buffer oxide on the substrate;

c) depositing a first amorphous silicon film on the buffer oxide;

d) depositing a low-temperature oxide on the amorphous silicon film, and forming a stop layer of the silicon film for dry etching after step d), and a thermal insulating layer for laser annealing of a hard mask preventing removal of a polysilicon spacer after recrystallization;

e) etching the amorphous silicon film by photoresist utilizing a hard mask on the low temperature polycrystalline silicon thin film transistor (LTPS-TFT) as a active layer, and then using a solution for wet isotropic etching of the amorphous silicon films to slightly perform an inner etching of the buffer oxide before or after the removal of the hard mask; and f) depositing another amorphous silicon film by connecting the amorphous silicon film, and then forming the polysilicon spacer by dry etching on either side of the active layer of the low temperature polycrystalline silicon thin film transistor (LTPS-TFT), and then forming large silicon grain structures of the active layer by recrystallization of high-energy continuous wavelength laser or recrystallization of excimer laser annealing on dog-bone shape active layer.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

The following descriptions of the preferred embodiments are provided to understand the features and the structures of the present invention.

Figure 1:
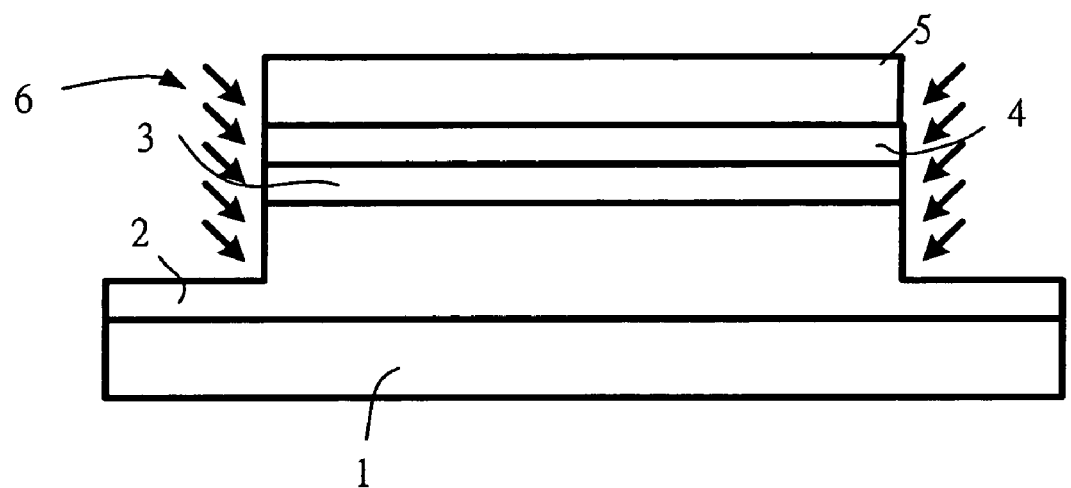
FIG. 1~FIG. 3 are schematic cross sections of the essential portion illustrating a process for manufacturing polycrystalline silicon thin film transistors according to the present invention.
Figure 2:
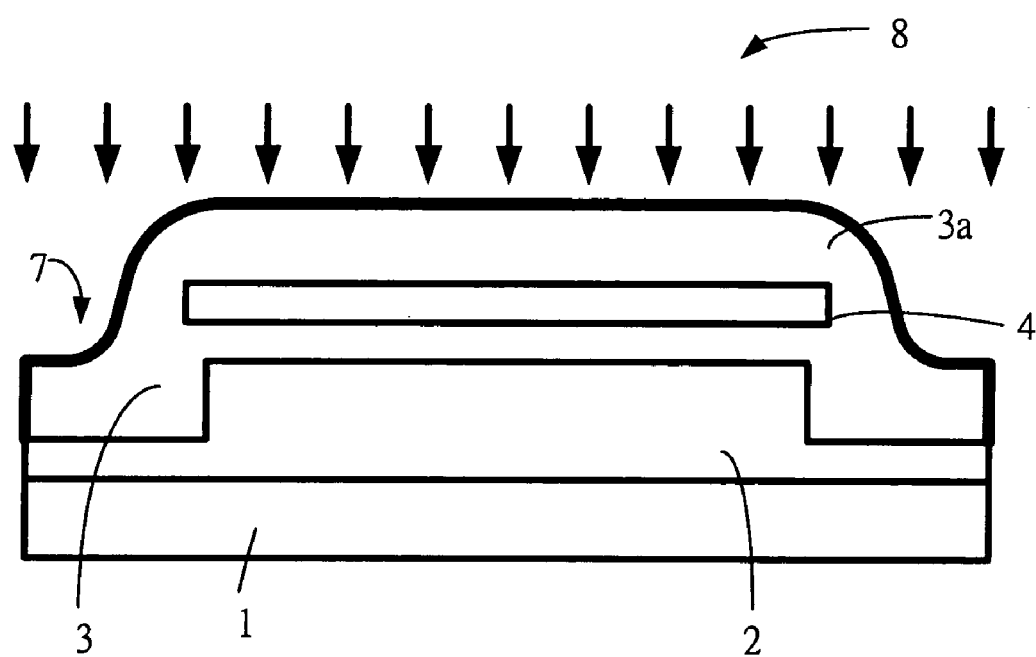
Figure 3:
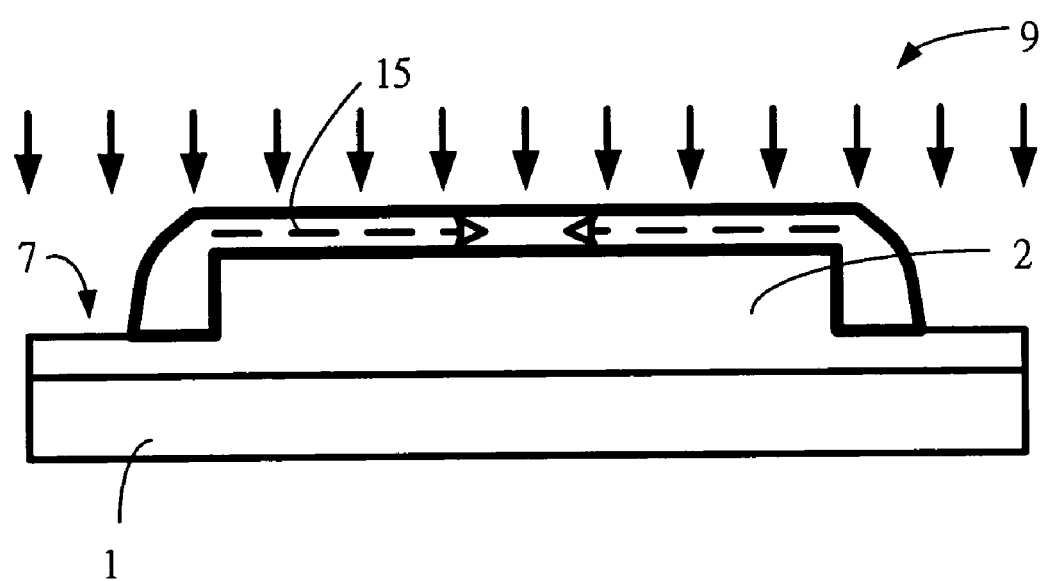

FIGS. 1–3 are schematic cross sections of an essential portion illustrating a process for manufacturing low temperature polycrystalline silicon thin film transistors (LTPS-TFT) comprising the steps of:

a) selecting a substrate 1;

b) forming a buffer oxide 2 on the substrate 1;

c) depositing a first amorphous silicon film 3 (active layer) on the buffer oxide 2;

d) depositing a low temperature oxide 4 on the first amorphous silicon film 3, and forming a stop layer of silicon film for dry etching after step d), and a thermal insulating layer for laser annealing of a hard mask preventing removal of a polysilicon spacer after recrystallization (step f);

e) etching the amorphous silicon film 3 by photoresist 5 utilizing a hard mask on the low temperature oxide, and then using a solution for wet isotropic etching of the amorphous silicon films to slightly go toward inner etching of the buffer oxide 2 before or after the removal of the hard mask;

f) depositing another amorphous silicon film 3a by connecting the amorphous silicon film 3, and then forming the polysilicon spacer 7 by dry etching 8 on either side of the another amorphous silicon film 3a and the amorphous silicon film 3. The polysilicon spacer 7 is selected from the group consisting of polycrystalline silicon film and amorphous silicon film. The polysilicon spacer 7 can replace the dielectric material with oxide, nitride, and metal oxide, etc. and metal material with aluminum (Al), wolfram (W), molybdenum (Mo) and chromium (Cr), etc. And then can choose to cancel the polysilicon spacer 7 or not for the next process. The polysilicon spacer 7 is formed on either side of the active layer (amorphous silicon film 3) of the low temperature polycrystalline silicon thin film transistor (LTPS-TFT), and then form large silicon grain structures of the active layer 3 according to a direction of grain growth 15 by recrystallization of high-energy continuous wavelength laser or recrystallization of excimer laser annealing 9 on dog-bone shape active layer as shown in FIG. 3. Therefore, the active layer generates a temperature gradient.

The polysilicon spacer 7 is formed on either side of the active layer selected from a group consisting of a thin film transistor (TFT) and a silicon-on-insulator metal oxide semiconductor field effect transistor (SOI-MOSFET) in a low temperature or high temperature process. The polysilicon spacer 7 is located under on either side of the active layer.

The main object of the polysilicon spacer 7 on laser-recrystallized either side of the active layer of the thin film transistor (TFT) is to generate a temperature gradient for recrystallization of the active layer. Moreover, the order of the steps for forming the polysilicon spacer 7 and recrystallization of the active layer can change, forms recrystallization of active layer by selecting from the group consisting of excimer laser annealing (ELA), solid phase crystallization (SPC) or metal-induced lateral crystallization (MILC), and then forming the polysilicon spacer 7 on either side of said active layer of the thin film transistor (TFT) or silicon-on-insulator metal oxide semiconductor field effect transistor (SOI-MOSFET).

Figure 4:
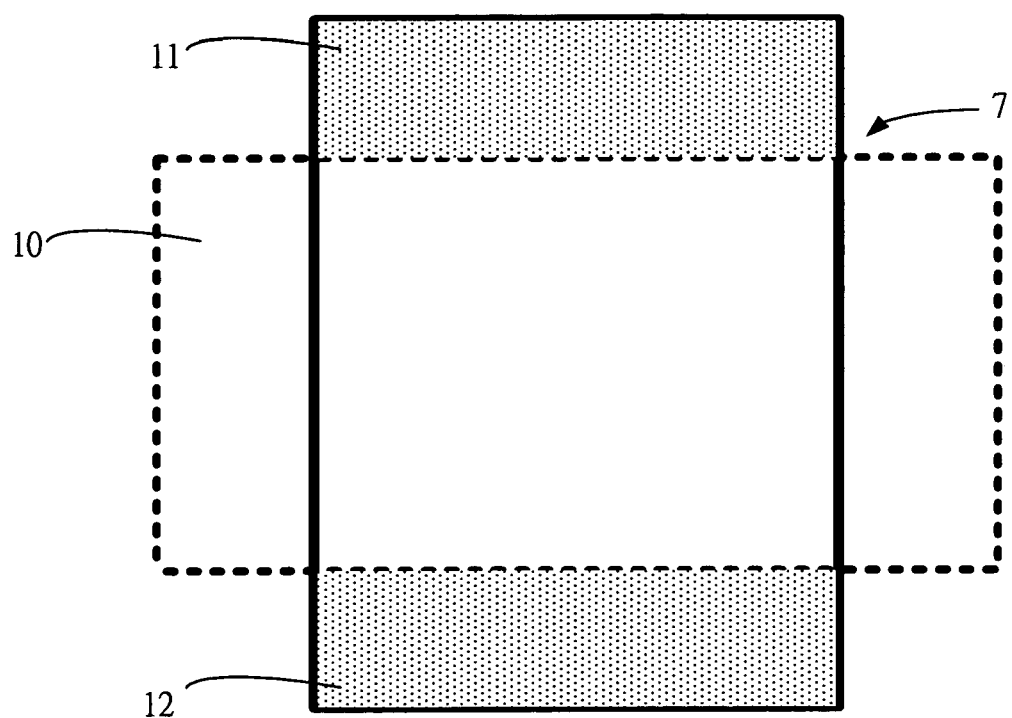
FIG. 4 is a schematic top plan view of relative position showing the laser-recrystallized active layer for polycrystalline silicon thin film transistors according to the present invention.
Figure 5:
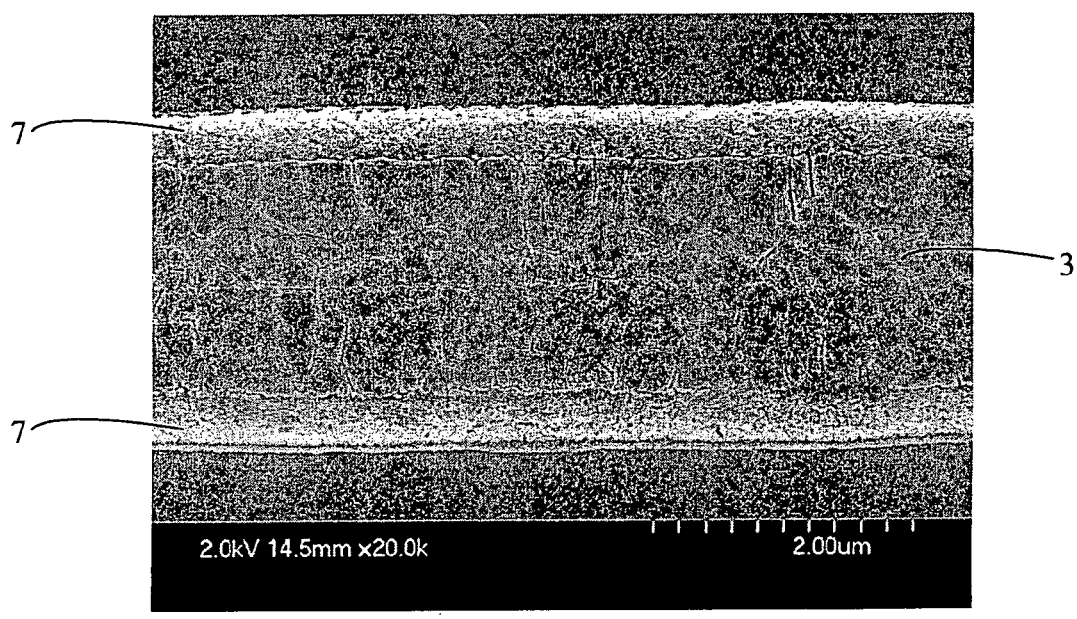
FIG. 5 is a scanning electron microscope (SEM) of silicon grain structures after excimer laser annealing (ELA) with silicon film thickness at 500 angstrom and line width at 2 microns according to the present invention.
Figure 6:
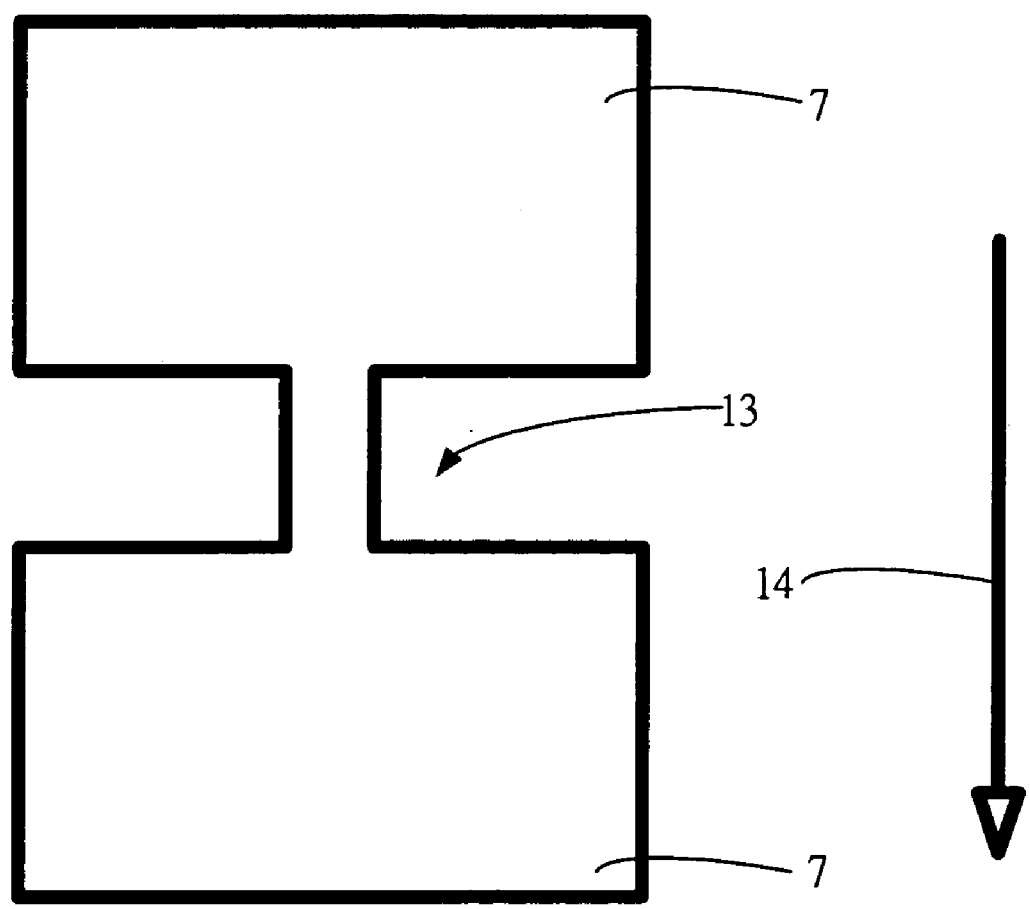
FIG. 6 is a schematic view showing active layer position and scanning direction of continuous-wavelength laser for recrystallization continuous-wavelength laser according to the present invention.
Figure 7:
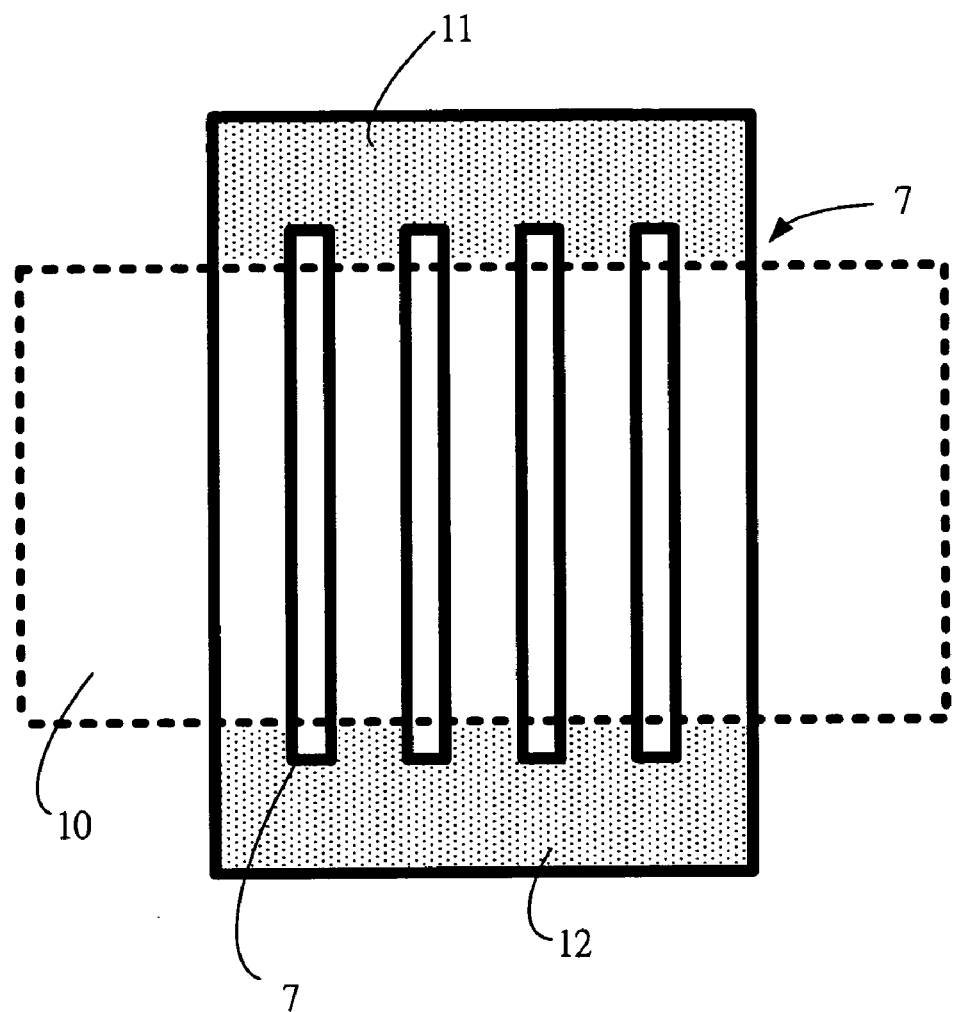
FIG. 7 is a conventional view of settlement of self-heating effect.

FIG. 4, shows the relative position of gate 10, source 11, and drain 12 to be surrounded by the side of active layer (amorphous silicon film 3) and the polysilicon spacer 7. Next, FIG. 5 is a scanning electron microscope (SEM) of silicon grain structures with silicon film thickness at 500 angstrom and line width at 2 microns after excimer laser annealing (ELA). It is clear that the elongated silicon grains measure over 1 micron with direction to side of active layer. Because the laser can't melt the thick boundary of active layer and can easily melt thin channel, and then the silicon grain trigger inner recrystallization by the spacer seed of the polysilicon spacer 7. Moreover, it also efficiently overcomes shrinkage effect of active layer caused by surface tension after melting of silicon film. Thus, the present invention is to efficiently improve the self-heating effect by forming a thick polysilicon spacer 7 without an extra mask on a side of the channel. FIG. 6 is a schematic view showing the active layer position with a dog-bone shape 13 and a scanning direction 14 of a continuous-wavelength laser for recrystallization utilizing the continuous-wavelength laser according to embodiment of the present invention.

The present invention may be embodied in other specific forms without departing from the spirit of the essential attributes thereof. Therefore, the illustrated embodiment should be considered in all respects as illustrative and not restrictive, reference being made to the appended claims rather than to the foregoing description to indicate the scope of the invention.

What is claimed is:

1. A method for fabrication of a low temperature polycrystalline silicon thin film transistor comprising the steps of:

a) selecting a substrate;

b) forming a buffer oxide on the substrate;

c) depositing a first amorphous silicon film on the buffer oxide, the first amorphous silicon film being an active layer;

d) depositing a low-temperature oxide on the first amorphous silicon film;

e) forming a hard mask being a photoresist on the low temperature oxide;

f) etching the buffer oxide utilizing a wet isotropic etching process:

g) depositing a second amorphous silicon film on the active layer;

h) forming a polysilicon spacer on either side of the active layer by dry etching; and i) forming large silicon grain structures in the active layer by annealing and recrystallization of an dog-bone shaped portion of the active layer utilizing one of a high-energy continuous wavelength laser and an excimer laser and recrystallizing the active layer as a polycrystalline silicon, wherein the low temperature oxide being a stop layer for the first amorphous silicon film during the dry etching process, a thermal insulating layer and a hard mask for the first amorphous silicon film during laser annealing thereby protecting the polysilicon spacer from removal.

2. The method according to claim 1, wherein the polysilicon spacer is selected from a group consisting of polycrystalline silicon film and amorphous silicon film.

3. The method according to claim 1, wherein the polysilicon spacer of the forming step h) is formed on two opposing sides of the active layer, the active layer is selected from a consisting of a thin film transistor (TFT) and a silicon-on-insulator metal oxide semiconductor field effect transistor (SOI-MOSFET) in one of a low temperature and a high temperature process.

4. The method according to claim 3, wherein in the forming step i) the annealing is performed utilizing a method selected from a group consisting of excimer laser annealing (ELA), solid phase crystallization (SPC), and metal-induced lateral crystallization (MILC), and the polysilicon spacer being formed on opposing sides to the active layer.

5. The method according to claim 1, wherein the polysilicon spacer of the forming step h) generates a temperature gradient.

6. The method according to claim 1, wherein the etching step (f) is performed before the removal of said hard mask.

7. The method according to claim 1, wherein the etching step (f) is performed after the removal of said hard mask.

* * * * *